United States Patent [19]
Jovanovich et al.

[11] Patent Number: 6,009,119
[45] Date of Patent: Dec. 28, 1999

[54] ADAPTIVE POWER LEVELING OF AN RF TRANSCEIVER UTILIZING INFORMATION STORED IN NON-VOLATILE MEMORY

[75] Inventors: Alan F. Jovanovich, Des Moines; John W. Mensonides, Monroe; Bruce G. Warren, Poulsbo, all of Wash.

[73] Assignee: Intermec IP Corp., Woodland Hills, Calif.

[21] Appl. No.: 08/823,611

[22] Filed: Mar. 25, 1997

[51] Int. Cl.⁶ .............................. H04B 1/38; H04L 27/28; H04L 27/04
[52] U.S. Cl. ........................... 375/219; 375/260; 375/295
[58] Field of Search ..................... 375/219, 220, 375/295, 260, 202; 330/259, 290, 136; 455/17, 234.1, 245.1, 73, 91

[56] References Cited

U.S. PATENT DOCUMENTS

| | | |
|---|---|---|
| 4,506,386 | 3/1985 | Ichikawa et al. . |
| 4,523,332 | 6/1985 | Mori . |
| 4,663,623 | 5/1987 | Lax et al. . |
| 4,736,390 | 4/1988 | Ward et al. . |
| 4,745,408 | 5/1988 | Nagata et al. . |
| 4,837,854 | 6/1989 | Oyagi et al. . |
| 4,839,639 | 6/1989 | Sato et al. . |
| 4,903,335 | 2/1990 | Shimizu . |
| 5,101,173 | 3/1992 | DiPiazza et al. ........................ 330/136 |
| 5,115,514 | 5/1992 | Leslie ......................................... 455/17 |
| 5,230,084 | 7/1993 | Nguyen . |
| 5,239,557 | 8/1993 | Dent . |
| 5,241,561 | 8/1993 | Barnard . |
| 5,241,566 | 8/1993 | Jackson . |
| 5,345,504 | 9/1994 | West, Jr. .............................. 455/234.1 |
| 5,381,133 | 1/1995 | Erhart et al. . |
| 5,410,734 | 4/1995 | Choi et al. . |
| 5,440,298 | 8/1995 | Kuramatsu . |
| 5,495,500 | 2/1996 | Jovanovich et al. . |
| 5,537,100 | 7/1996 | Hallberg . |
| 5,673,001 | 9/1997 | Kim ......................................... 330/126 |

*Primary Examiner*—Tesfaldet Bocure
*Attorney, Agent, or Firm*—O'Melveny & Myers LLP

[57] ABSTRACT

A radio frequency (RF) transceiver adaptively maintains power output level linearity across a broad spectrum of transmitting frequencies. The RF transceiver comprises a frequency synthesizer adapted to modulate an information signal across a plurality of distinct channels and an amplifier adapted to amplify the modulated information signal to a desired power level for transmission as an RF signal. The transceiver includes a table of offset values having individual entries corresponding to each of the distinct channels. A portion of the amplified and modulated information signal is sampled to provide binary values corresponding to instantaneous power levels of the transceiver. The offset values are calculated by comparing the sampled binary values to optimal binary values. Thereafter, an amount of amplification provided by the amplifier for an associated one of the channels is controlled in accordance with a corresponding one of the offset values from the table.

21 Claims, 2 Drawing Sheets

ADAPTIVE POWER LEVELING OF AN RF TRANSCEIVER UTILIZING INFORMATION STORED IN NON-VOLATILE MEMORY

BACKGROUND OF THE INVENTION

1. Field of the Invention

The present invention relates to radio communication systems, and more particularly, to an RF transceiver that adaptively maintains power output level linearity across a broad spectrum of transmitting frequencies.

2. Description of Related Art

Spread spectrum modulation techniques are increasingly desirable for communications, navigation, radar and other applications. In a spread spectrum system, the transmitted signal is spread over a frequency band that is wider than the minimum bandwidth required to transmit the information being sent. As a result of the signal spreading, spread spectrum systems have reduced susceptibility to interference or jamming, and enable high data integrity and security. Moreover, by spreading transmission power across a broad bandwidth, power levels at any given frequency within the bandwidth are significantly reduced; thereby reducing interference to other radio devices. In view of these significant advantages, spread spectrum communication systems are highly desirable for commercial data transmission.

In one type of spread spectrum communication system, a radio frequency (RF) carrier is shifted in discrete increments in a pattern dictated by a predetermined sequence. These spread spectrum systems are known as "frequency hopping" modulation systems, since the transmitter jumps from frequency to frequency in accordance with the predetermined sequence. Another type of spread spectrum communication system utilizes an RF carrier modulated by a digital code sequence having a bit rate, or chipping rate, much higher than the clock rate of the information signal. These spread spectrum systems are known as "direct sequence" modulation systems. The RF carrier may be modulated such that a data stream has one phase when a code sequence represents a data "one" and 180° phase shift when the code sequence represents a data "zero." In either type of spread spectrum system, a power amplifier within the transmitter amplifies the spread spectrum-modulated signal to the required output level and applies the amplified signal to an antenna.

It is also known to operate a plurality of spread spectrum radio transmitters/receivers (hereinafter "transceivers") together in a wireless local area network (LAN). A central host processing unit could send information to and receive information from any one of the plurality of remotely disposed transceivers. In such a wireless LAN, the remote transceivers may comprise portable units that operate within a defined environment to report information back to the central host processing unit. It should be apparent that such wireless LAN systems offer increased flexibility over more traditional hard-wired systems by enabling operators of the remote transceivers substantial freedom of movement through the environment.

Ideally, the output level linearity of a power amplifier for a spread spectrum communication system should be maintained as flat as possible so that the transmitted power level at each frequency channel is equal to that transmitted for every other frequency. In a frequency hopping system, variations in signal power reduce the ability of the transceiver to interpret the information contained within a transmitted message as well as reducing the immunity of the system to interference or jamming. Moreover, the reduction in power output of some channels has the effect of reducing the usable range of a transceiver in a LAN environment. While this effect is applicable to all constant envelope or angle modulated RF transmissions, it is especially detrimental to frequency hopping systems in which the channels are changed constantly. Each time the transmitter changes to a frequency having a lower power output, the range and/or throughput of the entire LAN is reduced. Direct sequence systems may also operate in a number of separate channels, and variations in output levels between the channels can similarly reduce the range and throughput of such systems.

The procedures for obtaining regulatory agency approval tend to further exacerbate the amplifier output level linearity problem. Certain governmental agencies, such as the Federal Communications Commission (FCC), have regulations that govern the total allowable power output of a radio transmitter. In order to obtain agency approval, the output power of the channel with the highest amplitude is typically adjusted to operate at the maximum power level permitted under the regulations. Since the output power varies over the operating band, the other channels will necessarily fall short of the maximum level.

Two techniques are known in the art to compensate for the non-linearity of the power amplifier: network compensation and analog feedback. Network compensation is an attempt to attenuate the input frequencies at the receiver through the use of matching networks in order to flatten the power output levels across the channels. This technique is undesirable since it wastes the output power of the higher power level channels, while also increasing the complexity and part count of the receiver. In the analog feedback technique, the transmitted channel outputs are sampled in real time to derive a corresponding DC voltage. The DC voltage is then shifted to a desirable level and fed back directly into the power amplifier bias circuitry. This technique is undesirable since it fails to account for the unique operating characteristics of the transmitter, and also adds complexity to the transmitter due in particular to the complex transfer function generated in the feedback loop.

Thus, it would be desirable to provide a transmitter that provides a linear output power level across a broad bandwidth of frequencies without impacting either performance or efficiency.

SUMMARY OF THE INVENTION

In accordance with the teachings of the present invention, a radio frequency (RF) transceiver is provided that adaptively maintains power output level linearity across a broad spectrum of transmitting frequencies.

The RF transceiver comprises a frequency synthesizer adapted to modulate an information signal across a plurality of distinct channels and an amplifier adapted to amplify the modulated information signal to a desired power level for transmission as an RF signal. The transceiver maintains a table of power offset values having individual entries corresponding to each of the distinct channels modulated by the frequency synthesizer. A portion of the amplified and modulated information signal is sampled to provide binary values corresponding to instantaneous output power levels of the transceiver. The power offset values are calculated by comparing the sampled binary values to optimal binary values. Thereafter, an amount of amplification provided by the amplifier for an associated one of the channels is controlled in accordance with a corresponding one of the power offset values from the table.

More particularly, the adaptive power leveling apparatus further comprises a directional coupler coupled to the amplification stage to permit the amplified and modulated information signal to pass therethrough prior to RF transmission. The directional coupler samples a portion of the amplified and modulated information signal. An envelope detector coupled to the directional coupler receives the sampled portion of the amplified and modulated information signal and provides a corresponding DC signal therefrom. An analog-to-digital converter coupled to the envelope detector converts the DC signal to sampled binary values. A non-volatile memory is coupled to the frequency synthesizer and comprises a table of offset values having individual entries corresponding to each of the distinct channels. The frequency synthesizer is adapted to receive the sampled binary values from the analog-to-digital converter and provide corresponding ones of the offset values for storage in the table. A digital-to-analog converter coupled to the amplification stage receives one of the stored offset values from the table for an associated one of the channels and converts the offset value to a DC bias value. The DC bias value is then used to control an amount of amplification provided by the amplification stage for the associated one of the channels. In a preferred embodiment of the present invention, the non-volatile memory further comprises a flash memory.

A more complete understanding of the adaptive power leveling apparatus will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the need for a transmitter that provides a linear output power level across a broad bandwidth of frequencies without impacting either performance or efficiency. In the detailed description that follows, like element numerals are used to describe like elements illustrated in one or more of the figures.

Figure 1:
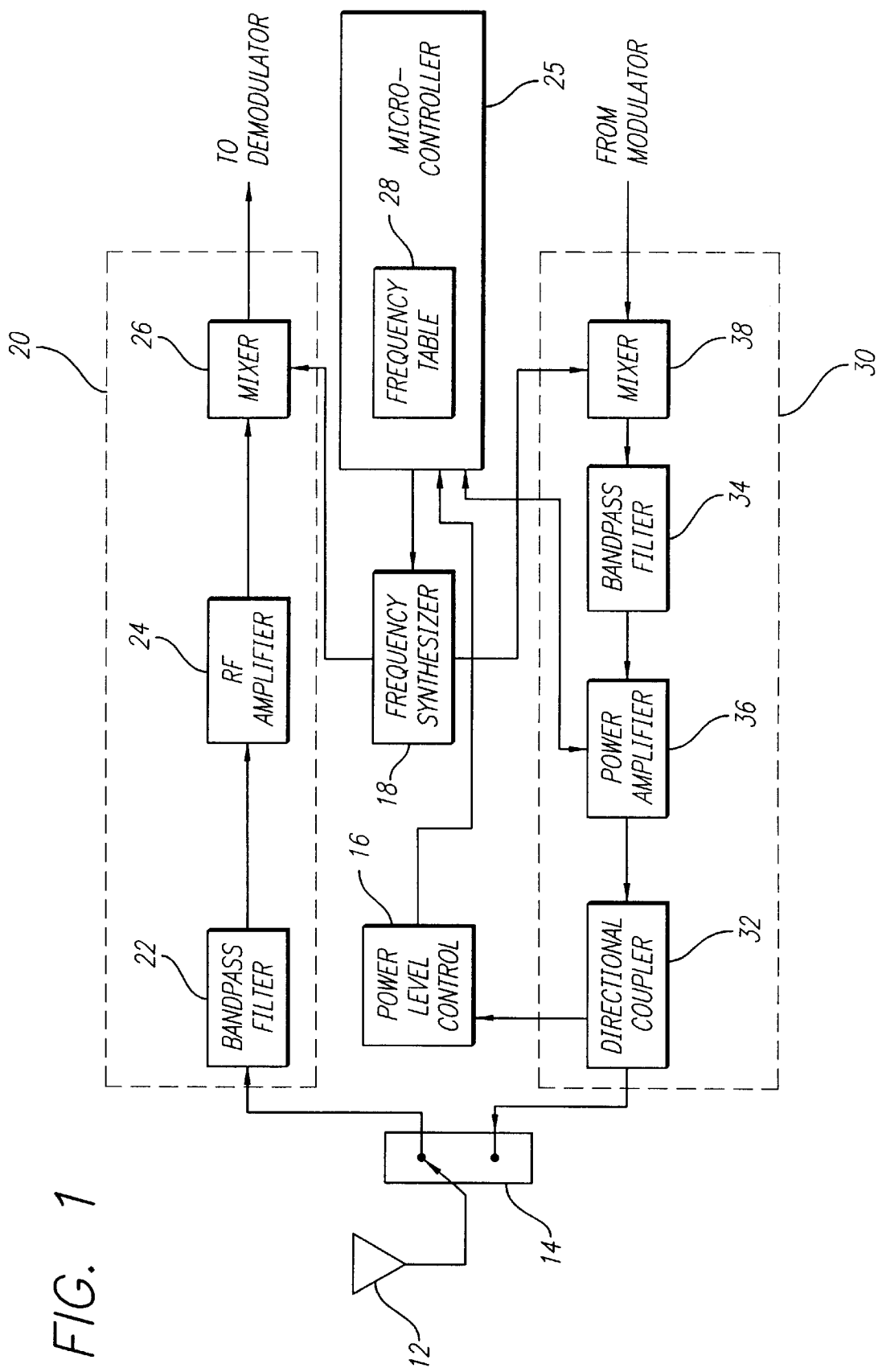
FIG. 1 is a block diagram of an RF transceiver adapted to communicate on a plurality of channels.

Referring first to FIG. 1, a block diagram of an RF transceiver adapted to communicate on a plurality of channels is illustrated. The transceiver includes a receiver portion 20 and a transmitter portion 30, and certain additional elements common to both the receiver and transmitter portions, including an antenna 12, a transmit/receive switch 14, a power level control unit 16, a frequency synthesizer 18, and a microcontroller 25. The transceiver illustrated in FIG. 1 provides spread spectrum modulation and demodulation of the "frequency hopping" type in which a carrier frequency is shifted in discrete increments in a predetermined pattern. It should be appreciated, however, that the teachings of the present invention are equally applicable to a "direct sequence" type transceiver or any other RF transceiver in which angle modulated communication signals are transmitted on plural channels.

The antenna 12 is provided for receiving and transmitting signals to and from the transceiver. The transmit/receive switch 14 has a common terminal that is electrically coupled to the antenna 12, and two contact positions electrically coupled to the receiver and transmitter portions 20, 30, respectively. The transmit/receive switch 14 enables the antenna 12 to be configured for either transmitting or receiving operations. As known in the art, the transmit/receive switch 14 can be provided by mechanical switch elements, such as a relay, or can comprise solid state switching circuitry. It is preferable that the transmit/receive switch 14 have generally high speed switching characteristics to reduce delays between receiving and transmitting operations.

Within the receiver portion 20, a received signal is first provided to a bandpass filter 22 which rejects adjacent extraneous frequencies outside the bandwidth of the received signal. An RF amplifier 24 amplifies the received and filtered signal to a desired amplitude level. A mixer 26 multiplies the amplified signal with a locally generated signal to produce a baseband received signal having a constant difference in frequency between the received signal and the locally generated signal. The locally generated signal comprises a frequency-shifted carrier generated by a frequency synthesizer 18 that is frequency shifted in accordance with a table 28 maintained within the microcontroller 25. Thereafter, the baseband received signal is provided to downstream demodulation stages that recover the information contained within the originally received signal.

The transmitter portion 30 essentially reverses the process performed by the receiver portion 20. Baseband signals to be transmitted are provided by upstream modulation stages to a mixer 38, along with the frequency-shifted carrier generated by the frequency synthesizer 18. The mixer 38 produces a modulated carrier signal comprising a multiplication product of the baseband signals with the locally generated frequency-shifted carrier. After the mixer 38, the modulated carrier signal is provided to a baseband filter 34 to attenuate extraneous frequency components. Thereafter, the modulated carrier signal is provided to a power amplifier 36 that amplifies the signal to a desired output level. Lastly, the amplified signal is provided to the antenna 12 for RF transmission.

The amplified and modulated carrier signal from the power amplifier 36 also passes substantially unaltered through a directional coupler 32. The directional coupler 32 comprises a pair of transmission lines arranged so that a portion of the RF energy passing through a primary transmission line in a first direction is coupled into a secondary transmission line. Accordingly, the RF signal in the secondary transmission line has a fixed relationship to the RF signal in the primary transmission line referred to as the coupling ratio. As known in the art, the amount of energy coupled into the secondary transmission line is normally less than 1% of the energy through the primary transmission line so that there is negligible power loss to the signal passing to the antenna 12. The directional coupler 32 thus provides a representative sample of the amplified and modulated carrier signal transmitted by the transceiver useful for controlling the output power level of the transceiver.

The sampled RF energy signal from the directional coupler 32 is provided to the power level control unit 16. The power level control unit 16 compares the sampled energy signal to a reference value and provides a difference signal to the microcontroller 25. The microcontroller 25 then provides a bias signal to the power amplifier 36 that causes the power amplifier to modify the amount of amplification applied to the signal from the bandpass filter 34. The microcontroller 25 also communicates with the frequency synthesizer 18 so that the sampled RF energy signal can be correlated with the current frequency or channel being provided to the mixer 38. In accordance with the present invention, the frequency table 28 within the microcontroller 25 which defines the pattern of frequency shifts has entries for bias signal values correlated to each of the frequencies provided by the frequency synthesizer 18. As the frequency synthesizer 18 shifts from frequency to frequency, the bias signal applied to the power amplifier 36 shifts in a like manner. The sampled energy signal from the directional coupler 32 may thus be used to constantly revise the table of bias signal values in order to account for changes in the performance characteristics of the transceiver that occur over time.

Figure 2:
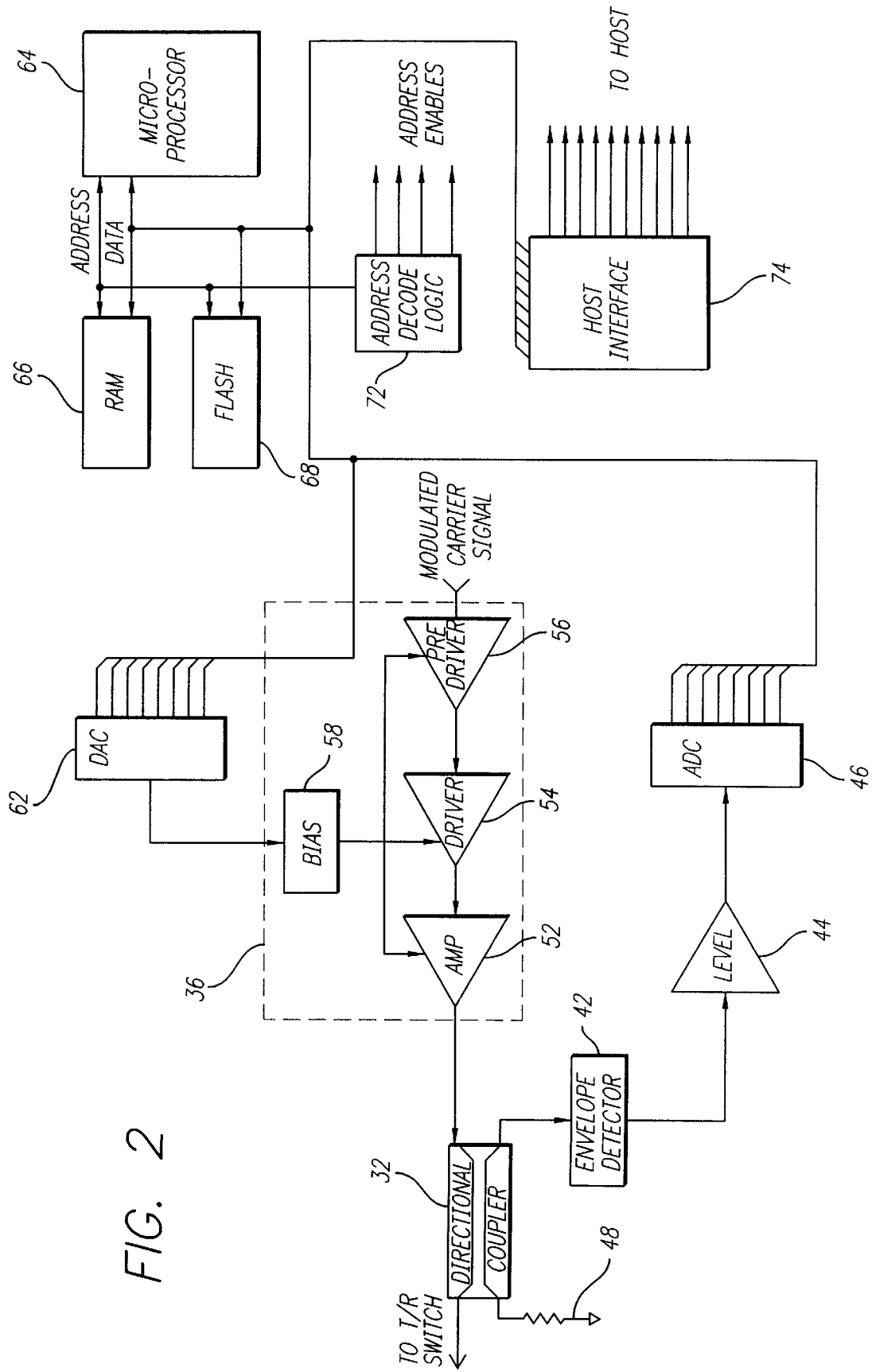
FIG. 2 is a block diagram of an adaptive power leveling circuit for use in the RF transceiver of FIG. 1.

Referring now to FIG. 2, a block diagram of an embodiment of an adaptive power leveling circuit for use in an RF transceiver is illustrated. As in FIG. 1, the modulated carrier signal passes through a power amplifier 36 and a directional coupler 32 to the transmit/receive switch of the transceiver. The power amplifier 36 further comprises a plurality of distinct amplification stages, including a pre-driver stage 56, a driver stage 54, and a final power amplifier stage 52. The pre-driver stage 56 boosts the signal level of the modulated baseband signal from the modulator, and the driver stage 54 further boosts the signal to supply input signal current to the final power amplifier stage 52. The final power amplifier stage 52 brings the modulated baseband signal up to the power level sufficient for RF transmission. A bias control unit 58 controls an amount of feedback passing between the amplifier stages to determine the output power level of the modulated baseband signal.

As described above with respect to FIG. 1, the amplified signal from the power amplifier 36 passes through the primary transmission line of the directional coupler 32. A sampled energy signal is coupled into the secondary transmission line of the directional coupler 34, and passes to an envelope detector 42. The secondary transmission line is coupled to ground through a termination resistor 48. The envelope detector 42 provides a DC voltage that follows the peak variation of the sampled energy from the modulated carrier signal. A level shifter 44 shifts the voltage level of the DC voltage from the envelope detector 42 into a suitable range for conversion to a binary value by an analog-to-digital converter 46. In a preferred embodiment of the present invention, the analog-to-digital converter 46 provides an eight bit binary output that corresponds to an instantaneous power level of the transceiver.

The binary output is provided onto a multi-bit data bus that interconnects a microprocessor 64, a random access memory (RAM) 66, a flash memory 68, an address decode logic unit 72 and a host interface unit 74. A multi-bit address bus also couples the microprocessor 64, random access memory (RAM) 66, flash memory 68, and address decode logic unit 72. The microprocessor 64 controls various functions of the transceiver, such as frequency synthesis, code generation, and transmit/receive switch timing. The RAM 66 provides volatile data storage for data values required by the microprocessor 64 for performance of its various functions. The host interface 74 and the address decode logic unit 72 provide for communication between the transmitter portion of the transceiver and a host portion that processes and utilizes the information that has been communicated. As known in the art, the microprocessor 64 performs its functions by executing a series of commands or instructions, also referred to as a software program, that may be disposed on a permanent storage medium, such as a semiconductor read only memory (ROM) device or a magnetic medium. It should be appreciated from the following discussion that the microprocessor 64, RAM 66 and flash memory 68 perform certain of the functions of the power level control unit 16, frequency synthesizer 18 and microcontroller 25 described above with respect to FIG. 1.

The flash memory 68 provides writable and non-volatile data storage for data values required by the microprocessor that must be able to remain intact for periods of time without an external power source. As known in the art, flash memory comprises a type of semiconductor device that has the characteristic of being alterable like a RAM device, but which also has the characteristic of non-volatility like a ROM device. It should be appreciated that the attributes of a flash memory device are particularly conducive to the present invention, since information stored in a flash memory can be modified, and would not be lost after power to the device is removed. Nevertheless, it should also be appreciated that other types of non-volatile storage devices, such as a semiconductor, magnetic or optical storage media, may be advantageously utilized in the present invention instead of flash memory.

The flash memory 68 includes a table of offset values that correspond to each of the distinct channels or frequencies synthesized by the microprocessor 64. The offset values relate to the difference between the actual power output of the transceiver for corresponding channels and a desired or optimum power output level for the channels. The microprocessor 64 accesses the table in the flash memory 68 by specifying a particular address on the address bus, and data values are read from and written to the flash memory through the data bus. The data bus also couples the microprocessor 64 to a digital-to-analog converter 62, which converts the binary offset values stored in the table to a DC voltage level provided to the bias control unit 58 to control the bias of the power amplifier 36.

During operation of the transceiver, a binary data value from the analog-to-digital converter 46 corresponding to sampled energy from the modulated carrier signal at a particular frequency is compared to an optimum power output value by execution of certain software functions by the microprocessor 64. Based on this comparison, the microprocessor 64 will calculate an offset value that would modify the characteristics of the power amplifier 36 to bring the channel to the optimum power output level. The offset value would also be stored in the table. This process is repeated for all the channels until the table is complete, whereupon the microprocessor 64 can correlate changes in the transmitter frequency to the appropriate bias signal provided to the power amplifier 36. Thereafter, the offset values may be continuously modified in real time to track performance changes to the power amplifier 36. As a result, a substantially linear output power level is provided by the transceiver across the entire spectrum of transmitted frequencies.

In the preceding discussion, the directional coupler 32 was described as being part of the transceiver to permit continuous sampling of the transmitted energy. Alternatively, the directional coupler 32 may comprise a separate element from the transceiver that is used only during periodic calibration of the transceiver. In this alternative embodiment, the table included in the flash memory 68 would not be continuously modified, but rather would be modified only during the periodic calibrations. During operation of the transceiver, the microprocessor 64 would utilize the offset values generated during a previous calibration.

Having thus described a preferred embodiment of an adaptive power leveling apparatus for an RF transceiver, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. In a radio frequency (RF) transceiver having a frequency synthesizer adapted to modulate a baseband information signal across a plurality of distinct channels and a power amplifier adapted to amplify said modulated signal to a desired power level for transmission as an RF signal, a power leveling apparatus comprises:

a directional coupler coupled to said amplification stage to permit said amplified and modulated information signal to pass therethrough prior to RF transmission, said directional coupler being adapted to sample a portion of said amplified and modulated information signal;

an envelope detector coupled to said directional coupler, said envelope detector receiving said portion of said amplified and modulated information signal and providing a corresponding DC signal therefrom;

an analog-to-digital converter coupled to said envelope detector, said analog-to-digital converter converting said DC signal to sampled binary values;

a non-volatile memory coupled to said frequency synthesizer, said non-volatile memory comprising a table of offset values having individual entries corresponding to each of said distinct channels, said non-volatile memory being adapted to receive said sampled binary values from said analog-to-digital converter and provide corresponding ones of said offset values for storage in said table; and a digital-to-analog converter coupled to said power amplifier, said digital-to-analog converter adapted to receive one of said stored offset values from said table for an associated one of said channels and convert said one of said offset values to a DC bias value used to control an amount of amplification provided by said power amplifier for said associated one of said channels.

2. The apparatus of claim 1, wherein said frequency synthesizer further comprises a microprocessor.

3. The apparatus of claim 2, further comprising a common data bus coupled to said microprocessor, said non-volatile memory, said analog-to-digital converter, and said digital-to-analog converter.

4. The apparatus of claim 1, wherein said non-volatile memory further comprises a flash memory.

5. The apparatus of claim 1, wherein said frequency synthesizer further comprises means for calculating said offset values by comparing said sampled binary values to optimal binary values.

6. The apparatus of claim 1, wherein said table further defines a frequency hopping pattern of said transceiver.

7. The apparatus of claim 1, wherein said directional coupler is further adapted to be uncoupled from said amplification stage for ordinary operation of said transceiver.

8. An adaptive power leveling apparatus for a radio frequency (RF) transceiver comprises:

a frequency synthesizer adapted to modulate an information signal across a plurality of distinct channels, said frequency synthesizer comprising a table of output power level offset values having individual entries corresponding to each of said distinct channels;

an amplifier adapted to amplify said modulated information signal to a desired power level for transmission as an RF signal; and means for controlling an amount of amplification provided by said amplifier for each respective one of said channels in accordance with corresponding ones of said output power level offset values stored in said table, whereby output power level linearity is maintained across said plurality of distinct channels.

9. The apparatus of claim 8, further comprising means for sampling a portion of said amplified and modulated information signal and providing sampled binary values corresponding to instantaneous power levels of said transceiver.

10. The apparatus of claim 9, further comprising means for calculating revised output power level offset values by comparing said sampled binary values to optimal binary values.

11. The apparatus of claim 8, wherein said controlling means further comprises a digital-to-analog converter coupled to said amplifier, said digital-to-analog converter adapted to receive a corresponding one of said output power level offset values from said table for an associated one of said channels and convert said corresponding one of said output power level offset values to a corresponding DC bias value.

12. The apparatus of claim 8, further comprising a non-volatile memory, said table being contained within said non-volatile memory.

13. The apparatus of claim 12, wherein said non-volatile memory further comprises a flash memory.

14. An adaptive power leveling apparatus for a radio frequency (RF) transceiver comprises:

a frequency synthesizer adapted to modulate an information signal across a plurality of distinct channels, said frequency synthesizer comprising a table having individual entries corresponding to each of said distinct channels;

an amplifier adapted to amplify said modulated information signal to a desired power level for transmission as an RF signal;

means for controlling an amount of amplification provided by said amplifier for each respective one of said channels in accordance with corresponding output power level offset values stored in said table; and means for sampling a portion of said amplified and modulated information signal and providing sampled binary values corresponding to instantaneous power levels of said transceiver, wherein said sampling means further comprises:

a directional coupler coupled to said amplifier to permit said amplified and modulated information signal to pass therethrough prior to RF transmission, said directional coupler being adapted to sample a portion of said amplified and modulated information signal;

an envelope detector coupled to said directional coupler, said envelope detector receiving said portion of said amplified and modulated information signal and providing a corresponding DC signal; and an analog-to-digital converter coupled to said envelope detector, said analog-to-digital converter converting said DC signal to said sampled binary values.

15. An adaptive power leveling apparatus for a radio frequency (RF) transceiver comprises:

a frequency synthesizer adapted to modulate an information signal across a plurality of distinct channels, said frequency synthesizer comprising a table having individual entries corresponding to each of said distinct channels;

an amplifier adapted to amplify said modulated information signal to a desired power level for transmission as an RF signal;

means for controlling an amount of amplification provided by said amplifier for each respective one of said channels in accordance with corresponding output power level offset values stored in said table;

means for sampling a portion of said amplified and modulated information signal and providing sampled binary values corresponding to instantaneous power levels of said transceiver;

means for calculating revised output power level offset values by comparing said sampled binary values to optimal binary values; and means for updating corresponding entries of said table with said revised output power level offset values.

16. In a radio frequency (RF) transceiver having a frequency synthesizer adapted to modulate an information signal across a plurality of distinct channels and an amplifier adapted to amplify said modulated information signal to a desired output power level for transmission as an RF signal, a method for leveling power across the channels comprises:

providing a non-volatile table for storing output power level offset values having individual entries corresponding to each of said distinct channels; and controlling an amount of amplification provided by said amplifier for an associated one of said channels in accordance with a corresponding one of said output power level offset values from said table in order to obtain substantially uniform power level across said plurality of distinct channels.

17. The method of claim 16, further comprising revising periodically said offset values in said table.

18. The method of claim 16, further comprising sampling a portion of said amplified and modulated information signal to provide sampled binary values corresponding to instantaneous power levels of said transceiver.

19. The method of claim 18, further comprising calculating said offset values by comparing said sampled binary values to optimal binary values.

20. The method of claim 18, wherein said sampling step further comprises:

receiving said portion of said amplified and modulated information signal and providing a corresponding DC signal; and converting said DC signal to said sampled binary values.

21. The method of claim 16, wherein said controlling step further comprises:

retrieving one of said stored offset values from said table for an associated one of said channels; and converting said retrieved one of said offset values to a corresponding DC bias value.

* * * * *